(12) United States Patent
Chi et al.

(10) Patent No.: US 8,451,646 B2
(45) Date of Patent: May 28, 2013

(54) RESISTIVE RANDOM ACCESS MEMORY AND THE METHOD OF OPERATING THE SAME

(75) Inventors: Min-hwa Chi, Shanghai (CN); Xiaohui Huang, Shanghai (CN); Lijun Song, Shanghai (CN); Jingang Wu, Shanghai (CN); Deyuan Xiao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 421 days.

(21) Appl. No.: 12/854,491

(22) Filed: Aug. 11, 2010

(65) Prior Publication Data
US 2011/0051496 A1 Mar. 3, 2011

(30) Foreign Application Priority Data
Aug. 28, 2009 (CN) .......................... 2009 1 0194782

(51) Int. Cl.
*G11C 11/00* (2006.01)
(52) U.S. Cl.
USPC .................. 365/148; 365/185.05; 365/185.18
(58) Field of Classification Search
USPC ................................ 365/148, 185.05, 185.18
See application file for complete search history.

(56) References Cited

U.S. PATENT DOCUMENTS

| | | | | |
|---|---|---|---|---|
| 5,729,494 A * | 3/1998 | Gotou et al. | ............. | 365/185.24 |
| 7,154,798 B2 * | 12/2006 | Lin et al. | ........................ | 365/209 |
| 8,194,451 B2 * | 6/2012 | Widjaja | .................... | 365/185.08 |
| 8,243,499 B2 * | 8/2012 | Widjaja | ........................ | 365/148 |
| 2005/0007852 A1 | 1/2005 | Moore et al. | | |
| 2010/0110793 A1 * | 5/2010 | Kim et al. | ................. | 365/185.18 |
| 2012/0051143 A1 * | 3/2012 | Yoon et al. | ............... | 365/185.22 |
| 2012/0051170 A1 * | 3/2012 | Yoon et al. | ............... | 365/230.03 |

* cited by examiner

*Primary Examiner* — Tuan T. Nguyen
(74) *Attorney, Agent, or Firm* — Squire Sanders (US) LLP

(57) ABSTRACT

A resistive random access memory utilizing gate induced drain leakage current as the read operation current and the write operation current and a method of operation the same, wherein the resistive random access memory including a plurality of arrayed memory cells, a plurality of bit-lines and a plurality word-lines, each memory cell including: a switching resistor having a first terminal and a second terminal, the first terminal of the switching resistor being connected to one bit-line; and a MOSFET being connected to the second terminal and having a gate, a source, a drain and a substrate, the gate being connected to one word-line, the read operation current and the write operation current of the memory cell being gate induced drain leakage current of the MOSFET. The RRAM array presented in this invention has superior scalability for resistors as well as transistors, which leads to a memory array with higher density.

10 Claims, 16 Drawing Sheets a first voltage $V_H$ (~Vcc/2) is applied to the bit line to produce a large enough voltage across the drain and the substrate of the select transistor — S110 a second voltage pulse is applied to the gate of the select transistor through the word line for a short duration — S111 a first voltage $V_H$ applied to the bit line to produce a large enough voltage difference across the drain and the substrate of the MOSFET — S210 a second voltage puls is applied to the gate of the MOSFET through the word line for a short duration — S211 a third voltage $V_L$ is applied to the bit line to produce a small voltage difference between the drain and the substrate of the MOSFET — S220 a fourth voltage pulse is applied to the gate of the select transistor through the word line for a short duration — S221

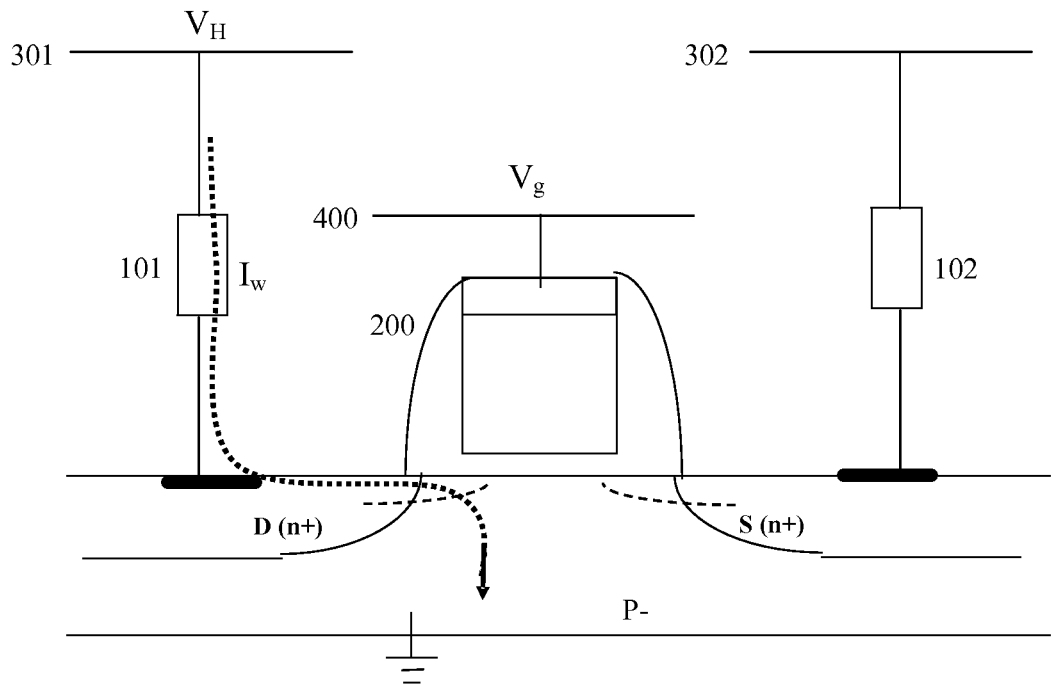

Fig. 13a a first voltage $V_H$ is applied to the first bit line or the second bit line to produce a large voltage difference between the first bit line and the substrate of the MOSFET or between the second bit line and the substrate of the MOSFET — S310 a second voltage $V_g$ is applied to the word line so as to form a GIDL current pulse through the word line, and the resistance state of the first switching resistor or the second switching resistor is changed by the GIDL current pulse, the data is stored in the switching resistor of the memory cell correspondently — S311

Fig. 13b

RESISTIVE RANDOM ACCESS MEMORY AND THE METHOD OF OPERATING THE SAME

CROSS REFERENCE TO RELATED APPLICATIONS

The present application claims the priority of Chinese Patent Application No. 200910194782.6, entitled "A resistive random access memory and the method of operating the same", and filed Aug. 28, 2009, the entire disclosure of which is incorporated herein by reference.

BACKGROUND OF THE INVENTION

1. Field of the Invention

The present invention relates to integrated circuit, and particularly relates to a resistive random access memory and the method of operating the same.

2. Description of Prior Art

Recently, a new-type of non-volatile memory technology, the resistive random access memory (RRAM), has attracted much attention due to its high density, non-volatile storage, fast write and read, compatible with CMOS process, and low power consumption. The resistor in an RRAM cell has bi-stable resistance states with good retention and is switchable between states when a large enough voltage or current pulse (or power pulse) is applied.

The RRAM includes an array of memory cells organized in rows and columns as illustrated in FIG. 1, where a memory cell 100 includes a switching resistor 101 and a select transistor 102 (as referred to as 1T1R cell). The select transistor 102 is assumed an n-type MOSFET (or briefly as n-MOS) for selecting the memory cell 100 to perform the read/write operations. The switching resistor 101 has two terminals, one of which is connected to a bit-line 103, and the other is connected to the drain of the select transistor 102. The gate of the select transistor 102 is connected to a word-line 104, and the source of the select transistor 102 is grounded. The bi-stable resistance states of the switching resistor 101 represent the digital data '1' and '0' as corresponding to the high and low resistance states respectively.

FIG. 2 illustrates a conventional method of operating the RRAM in FIG. 1. The method includes a write operation and a read operation.

During the write operation of the selected memory cell, a high voltage $V_H$ (+Vcc) is applied to the bit-line 103. The select transistor 102 (n-MOS) can be turned on by applying a voltage (+Vcc) on the gate of the select transistor 102 through the word-line 104, then a large current flows through the switching resistor 101 and the resistance state of the switching resistor 101 can be changed depending on the magnitude of current and pulse duration. The resistance state of the switching resistor 101 can be changed into a low resistance state (referred to as SET operation), or reversely, into a high-resistance state (referred to as RESET operation). It should be noted that by controlling the transient pulse parameter (e.g. height and duration), the RESET operation (to write "1") and SET operation (to write "0") can be intentionally performed (not shown in the waveforms of word-line voltage and resistor current in FIG. 2).

During the read operation on the selected memory cell, a lower voltage $V_L$ (~0.05 v to 1 v) is applied to the bit-line 103. Then the select transistor 102 is turned on by applying a voltage (+Vcc) to the word-line 104. The voltage across the switching resistor 101 is small enough to avoid disturb on the resistance state of the resistor 101 and also large enough for the sense amplifier to detect the current through the resistor 101. The stored data in the memory cell 100 is determined by the current measured in sense amplifier, e.g. a larger current represents data '0' (corresponding a smaller resistance) and a smaller current represents data '1' (corresponding to a larger resistance) Typically, the ratio of larger to smaller current shall be >5.

During the write operation of a selected memory cell, those un-selected cells (on the same bit-line 103) experience gate-induced-drain-leakage (GIDL) current flowing through resistors and transistor's drain into the ground due to the bias at gate (i.e. 0 v for un-selected word-lines) and +Vcc at the selected bit-line. Thus, in the conventional RRAM, the GIDL current continuously flowing through the switching resistor and results in disturb and degraded data retention time, ... etc.

An illustration of the mechanism of GIDL current in an n-MOS is shown in FIG. 3, with components (a) and (b) included in GIDL current. Component (a) is based on the classical model of GIDL related to the holes generated at the interface between the gate oxide and n-type lightly doped drain (LDD) extension, and subsequently flowing toward the p-well (or substrate). FIG. 3a illustrates how the vertical field (perpendicular to the interface of gate oxide and LDD region) results in band-bending of the LDD region and subsequent band-to-band tunneling (BTBT) of valence band electrons into the depleted $n^+$ drain (i.e. holes generated at the interface). The generated holes will flow toward the p-well due to the electrical field from the reverse biased $n^+$ drain to p-well junction. As shown in FIG. 3b, component (b) is related to the hole generation in the bulk near the interface through the reverse biased n+ drain to p-well junction by valence band electron BTBT if the channel doping is high. This valence band electron BTBT current (component (b)) is based on the same mechanism as the well-known "Zener" diode breakdown. In 45 nm CMOS node and beyond, the channel doping is significantly high, thus the component (b) is dominating than component (a). While, at earlier CMOS nodes (e.g. 0.25 um and earlier), the channel doping is not high enough, and the component (a) could be dominating. As shown in FIG. 3a (for n-MOS), the drain to gate bias $V_{gd}$ needs to be negative enough to result in enough band-bending slightly larger than the band-gap (Eg), in this way the BTBT mechanism for components (a) and (b) is triggered. Similarly, in p-type MOSFET (or briefly as p-MOS), electrons occur at the interface of $p^+$ drain by BTBT of holes under "off" bias and GIDL current of electrons flows toward n-well. As well known, GIDL current can be enhanced by various techniques, e.g. eliminating spacer and LDD implant, reversing the doping polarity of poly gate, ... etc.

It should be noted that the source and drain in MOSFET are typically the same in structure, thus the GIDL current will occur at the source side also as long as Vgs<0 v (for n-MOS), though the original study of the BTBT current was based on the leakage current observed at the drain side and it is traditionally referred to as the gate-induced-"drain"-leakage (GIDL) current.

Various approaches have been proposed in the prior art for suppressing the GIDL phenomena in MOSFET, e.g. increasing the thickness of the gate oxide, reducing LDD doping, less overlap area between gate oxide and LDD, ... etc. However, there are very few studies toward how to enhance and utilize the GIDL current of the MOSFET for useful device operation.

SUMMARY OF THE INVENTION

An objective is to provide a resistive random access memory (RRAM) utilizing the GIDL current as the operating current for read and write operations.

A further objective is to provide a method of operating the RRAM in the invention.

From the first aspect of the present invention, the RRAM includes a plurality of memory cells in an array, a plurality of bit-lines and a plurality of word-lines, each memory cell comprising: a switching resistor having a first terminal and a second terminal, the first terminal of the switching resistor being connected to one bit-line; and a MOSFET being connected to the second terminal and having a gate, a source, a drain and a substrate, the gate being connected to one word-line, the read and write operation current of the memory cell being the GIDL current of the MOSFET.

From the second aspect of the present invention, the method of operating the RRAM includes a write operation and a read operation. During the write operation, the method comprises steps of: applying a first voltage to the bit-line; applying a second voltage to the word-line to trigger GIDL current pulse through the switching resistor for resistance change (i.e. writing data to the memory cell). During the read operation, the method comprises steps of: applying a third voltage to the bit-line; applying a fourth voltage to the word-line to trigger GIDL current through the switching resistor for measuring the resistance (i.e. reading data stored in memory cell). Typically, the GIDL current in read operation is at least 10× smaller than in write operation to avoid "read disturb".

Many benefits can be achieved by way of the present invention over conventional techniques. For example, the power consumption of select transistors can be reduced by utilizing GIDL current as the read and write operation current, the RRAM array presented in this invention has superior scalability for resistors and leads to a memory with higher density.

BRIEF DESCRIPTION OF THE DRAWINGS

FIG. 13a illustrates the write operation (of third method) on the third RRAM.

FIG. 13b is a first flow chart of the write operation (of the third method) according to the present invention.

DETAILED DESCRIPTION OF THE EMBODIMENTS

GIDL current is generally regarded as a negative effect in MOSFETs, therefore, various approaches have been proposed in the prior art for suppressing the GIDL in MOSFETs. The present invention provides a method of operating a resistive random access memory (RRAM) by utilizing the GIDL current in MOSFETs.

As previously described in the background, a MOSFET at the off-state in circuits may have GIDL current flowing through the drain to well (or substrate) when the gate is biased at off-state. The GIDL current in MOSFET can be maximized by reversing the doping type of the poly-gate (i.e. $n^+$ doped poly-gate for a p-MOS, or $p^+$ doped poly-gate for a nMOS), or selectively removing the spacer and adding extra LDD implant dose (by using extra masking steps). Thus the GIDL currents of the select transistor can be large enough and useful for the read/write operation of the switching resistor.

Our invention provides several embodiments of resistive random access memory (RRAM) and the method of operating the same. The details are in below.

Figure 1:
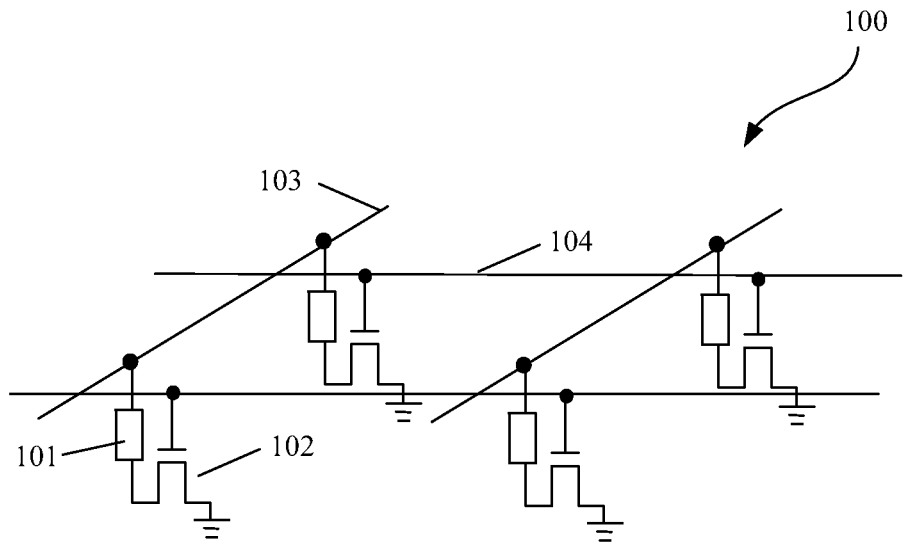
FIG. 1 is a schematic diagram of a conventional RRAM array.
Figure 2:
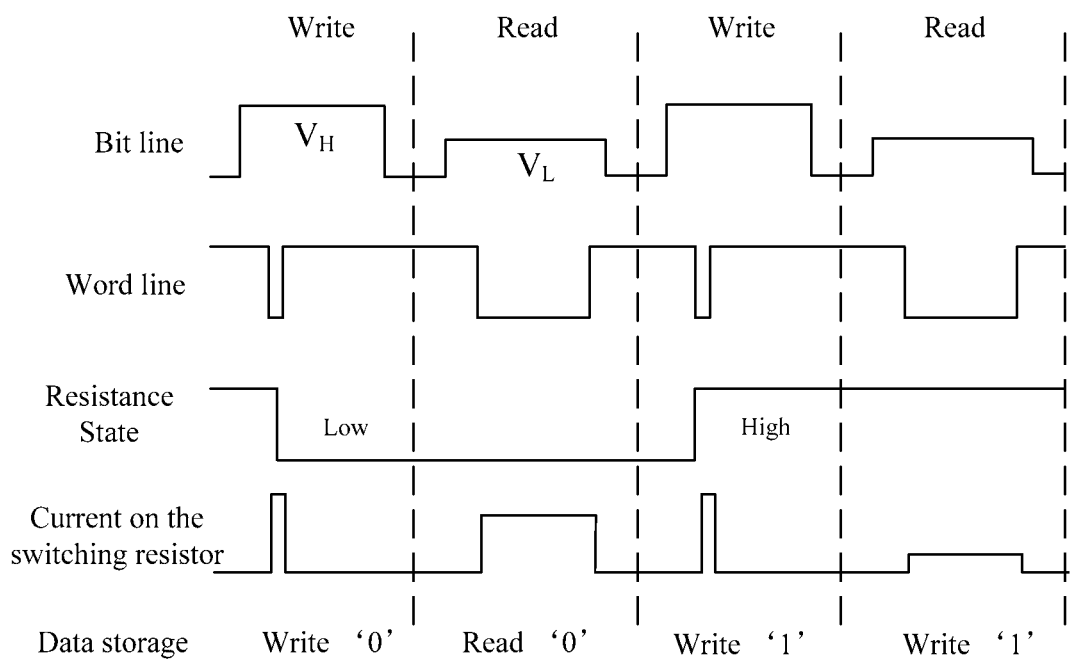
FIG. 2 illustrates a conventional pulse scheme for operating the RRAM in FIG. 1.
Figure 3:
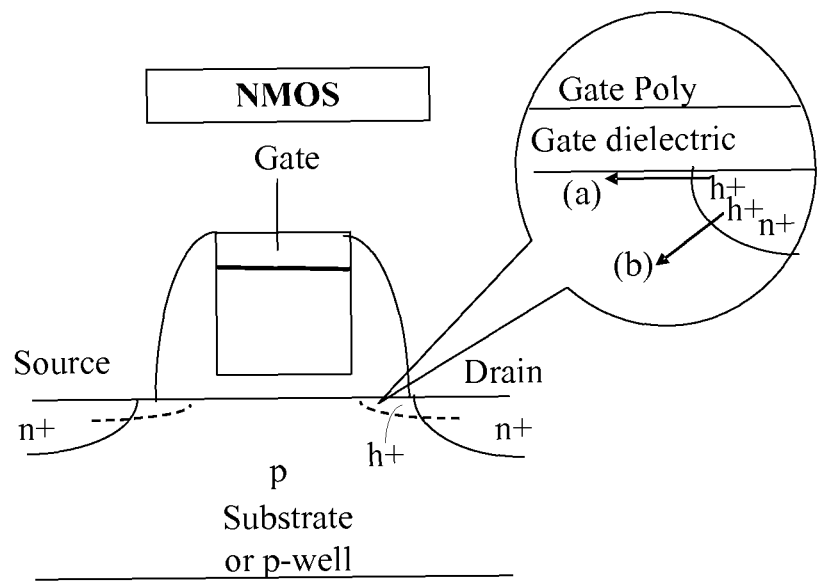
FIG. 3 illustrates the mechanism of GIDL current in an n-type MOSFET.
Figure 3A:
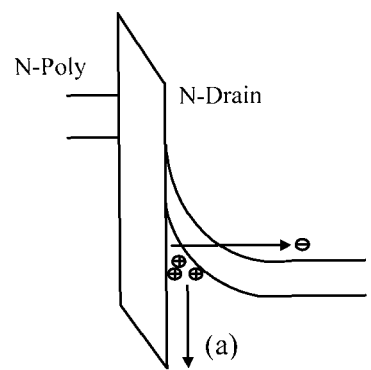
FIG. 3a illustrates how the vertical field results in band-bending at drain side and subsequent valence electrons tunnel into the $n^+$ drain by band-to-band tunneling (BTBT) mechanism.
Figure 3B:
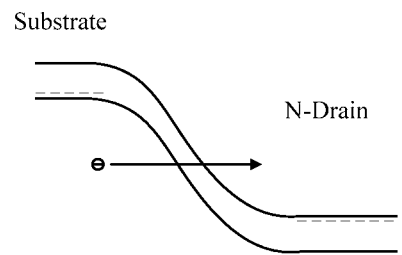
FIG. 3b illustrates the hole generation in the bulk near the interface through the reverse biased n+ drain to p-well junction.
Figure 4:
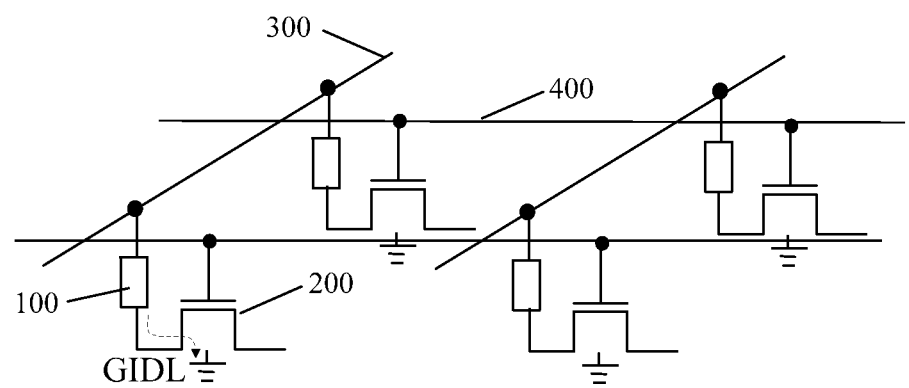
FIG. 4 is the schematic diagram of a first RRAM according to an embodiment of the present invention.

Referring to FIG. 4, the first RRAM of the present invention includes a plurality of memory cells in array with bit-lines and word-lines. Each memory cell comprises a switching resistor 100 and a select transistor 200 and is referred to as 1T1R cell. The switching resistor 100 comprises a first terminal and a second terminal. The first terminal of the switching resistor 100 is connected to a bit-line 300, and the second terminal of the switching resistor 100 is connected to the select transistor 200. The select transistor 200 is a MOSFET and has a gate, a source, and a drain. The gate of the select transistor 200 is connected to a word-line 400. The read and write operation current is the GIDL current of MOSFET.

One of the source or drain of the MOSFET is connected to the switching resistor 100 (and the other one can be left un-connected or floating as in FIG. 4). As a better way, the source and drain of the MOSFET can be connected together (not shown in FIG. 4) so that GIDL current generated from both the drain and source sides can contribute together as a larger current through the switching resistor 100 during write and read operations.

The select transistor 200 is assumed an n-type MOSFET for illustrations in the text. During the read or write operation, the gate (word-line 400) of select transistor is biased negatively (e.g. −Vcc/2) than the drain/source (bit-line 300), so that the GIDL current through the selected MOSFET is produced. It should be noted that the word-line bias is always lower than the threshold voltage (Vt) of the n-MOS during operations, so that there is no inversion channel between the source and the drain. Additionally, if the select transistor 200 is a p-MOS, then the RRAM cell also performs well with proper reversing the bias polarity, e.g. the gate is biased more positive than the drain/source for triggering the GIDL current in p-MOS. For simplicity, the details of memory cell operations using p-MOS as select transistor is not repeated here for simplicity.

It should be noted that the switching resistor 100 has bi-stable resistance states and it can be switchable. The resistive states are sensed by measuring the current through the switching resistor 100 at a fixed bias and comparing with respect to a reference current (provided by periphery circuits) in sense-amplifier.

Based on the first RRAM of the present invention, a first method of operating the first RRAM is described below, which includes a write operation and a read operation.

Figures 5A, 5B:
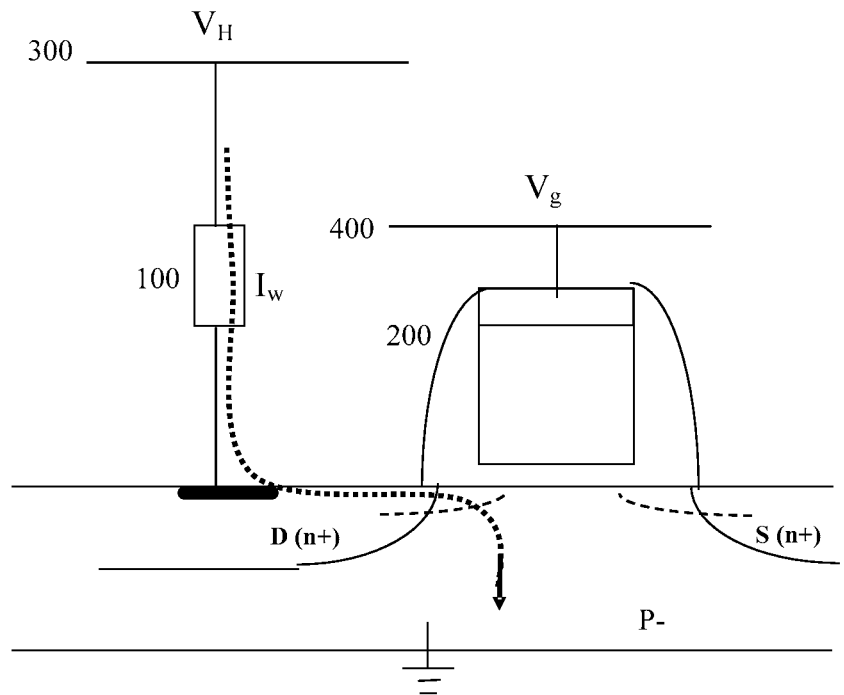
FIG. 5a illustrates the write operation (of the first method) on the first RRAM.
FIG. 5b is a flow chart of the write operation (of the first method) according to the present invention.
Figure 7:
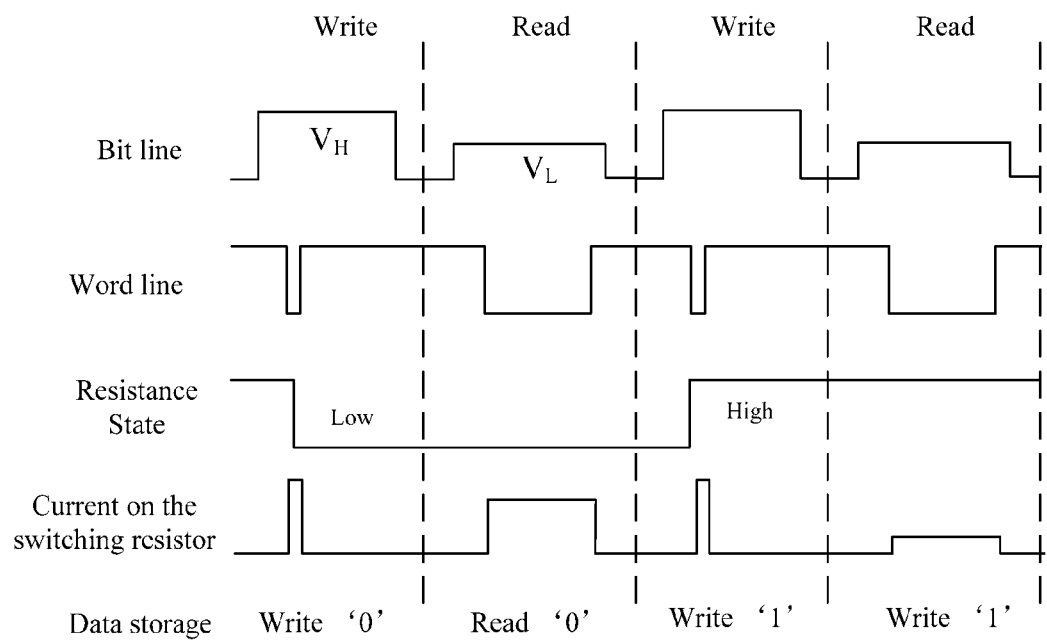
FIG. 7 shows the pulse scheme (for the first method) of operating the first RRAM.

FIG. 7 illustrates the pulse waveforms for the first method of operating the first RRAM. FIG. 5a illustrates how the "write" current $I_W$ flows through the switching resistor 100, the n+ drain, and into the p-type substrate of the select transistor 200 during the write operation (of the first method). FIG. 5b is a flow chart of the write operation (of the first method) according to the present invention. Referring to FIGS. 5a, 5b and 7, the write operation of the first method comprises the following steps:

Step S110, a first voltage $V_H$ (+Vcc/2) is applied to the bit-line 300 to produce a large enough voltage across the drain and the substrate of the select transistor 200.

The source of the select transistor 200 is connected to ground.

Step S111, a second voltage pulse is applied to the gate of the select transistor 200 through the word-line 400 for a short duration (~us to <1 ms). This voltage pulse on gate (or the selected word-line) is negative going from 0 v to −Vcc/2, so that a large enough write current pulse $I_w$ flows and triggers the resistance change of the switching resistor 100. It should be noted that the magnitude of the write current pulse $I_w$ can be adjusted to be larger if the gate pulse is more negative with larger magnitude.

Those un-selected word-lines and un-selected bit-lines are biased at 0 v. Regarding those un-selected memory cells, their worst bias from gate to drain is −Vcc/2 and only occur on those cells at the same bit line or word line (as those of the selected cell) and no serious degradation to resistors. (Note that the un-selected cells in conventional RRAM experience the worst bias of Vcc and trigger significant GIDL current to degrade the resistance states). According to an embodiment of the present invention, a high resistance state of the switching resistor 100 represents data '1' and a low resistance state represents data '0' correspondently.

Figure 6A:
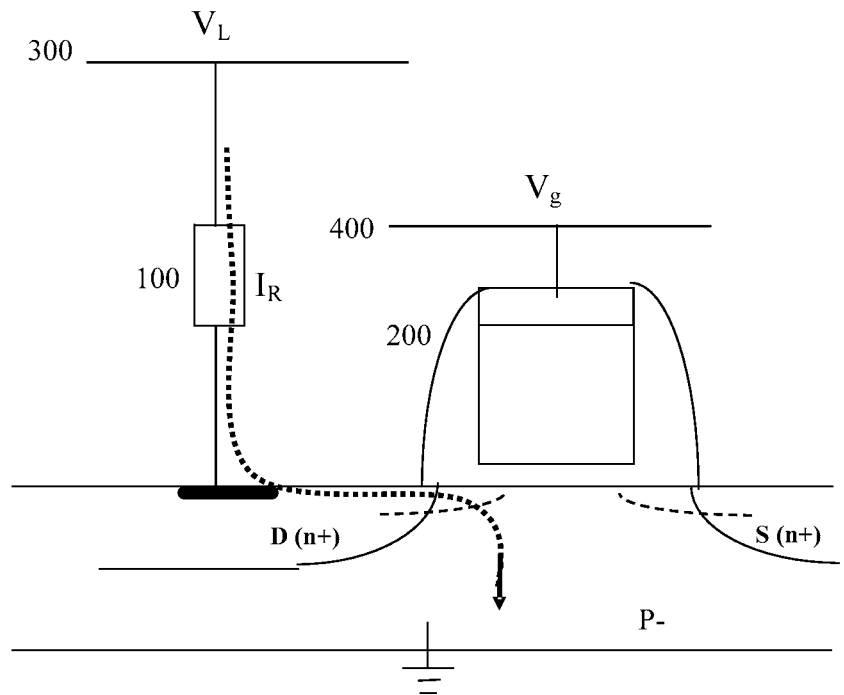
FIG. 6a illustrates the read operation (of the first method) on the first RRAM.
Figure 6B:
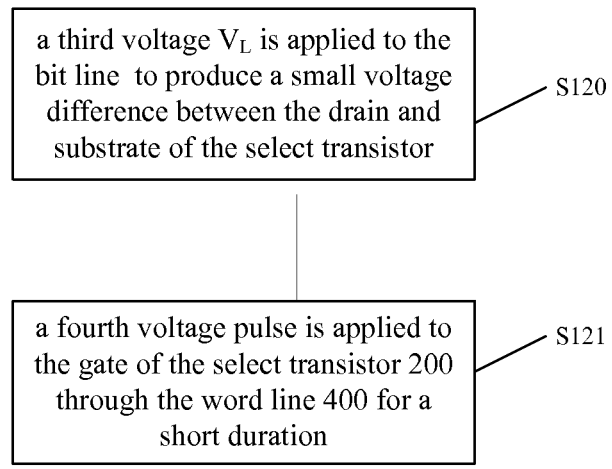
FIG. 6b is a flow chart of the read operation (of the first method) according to the present invention.

FIG. 6a illustrates the read operation (of the first method) on the first RRAM. FIG. 6b is a flow chart of the read operation (of the first method) according to the present invention. With reference to FIGS. 6a, 6b and 7, the read operation of the first method comprises the following steps:

Step S120, a third voltage $V_L$ is applied to the bit-line 300 to produce a small voltage difference between the drain and substrate of the select transistor 200.

Typical $V_L$ is in the range of 0.05 v to 1 v and it shall be properly selected so that the GIDL current is large enough for sense amplifier and small enough to avoid disturb on the resistance.

Step 121, a fourth voltage pulse is applied to the gate of the select transistor 200 through the word-line 400 for a short duration (~us to <1 ms). This voltage on gate (or selected word-line) is negative going (from 0 v to −Vcc/2) so that a large enough read current is resulted for sense amplifier to determine the stored data in the switching resistor 100. The sense amplifier simply compares the read current with respect to a reference current.

A larger read current ($I_R$) with respect to the reference current corresponds to a low resistance state of the switching resistor 100 and defined as data '0'; while a smaller $I_R$ corresponds to a high resistance state and defined as data '1'.

Figure 8:
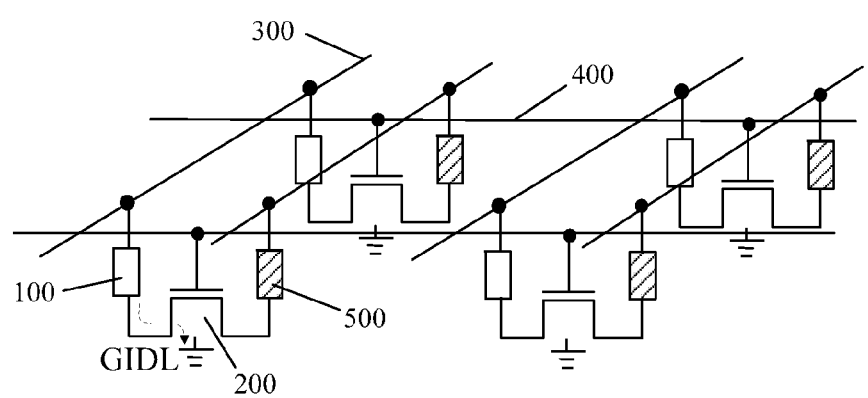
FIG. 8 is the schematic diagram of a second RRAM according to an embodiment of the present invention.

FIG. 8 is the schematic diagram of a second RRAM according to an embodiment of the present invention. Reference to FIG. 8, the second RRAM of the present invention includes a plurality of memory cells arranged in array with bit-lines and word-lines. Each memory cell includes: a switching resistor 100 having a first terminal and a second terminal, the first terminal of the switching resistor 100 being connected to a bit-line 300; a reference resistor 500 having a third terminal and a fourth terminal, the third terminal of the reference resistor 500 being connected to a bit-line 300; a MOSFET 200a having a gate, a source, and a drain and being connected to the second terminal of the switching resistor 100 and the fourth terminal of the reference resistor 500, the gate being connected to a word-line 400. The operation current of the read and the write operation current of the memory cell is GIDL current of the MOSFET 200.

It should be noted that the value of the reference resistor 500 is constant within the range of the switching resistor.

Otherwise, the source of the MOSFET 200a is connected to the second terminal of the switching resistor 100a, and the drain of the MOSFET 200a is connected to the fourth terminal of the reference resistor 500. The substrate of the MOSFET 200a is connected to ground.

The MOSFET 200a is assumed an n-type MOSFET. In read or write operations, the voltage applied to the gate (or the word-line 400) is always less than the threshold voltage (Vt) of the MOSFET 200a, so that there is no inversion channel formed between the drain and the source during read and write operations. It is well-known that the Vt of MOSFET can be adjusted to be high by larger channel dopant concentration.

The switching resistor 100 has bi-stable resistance states, which can be altered by the current pulse flowing in the switching resistor 100.

Based on the second RRAM of the present invention, a second method of operating the first RRAM is described below, which includes a write operation and a read operation.

Figures 9A, 9B:
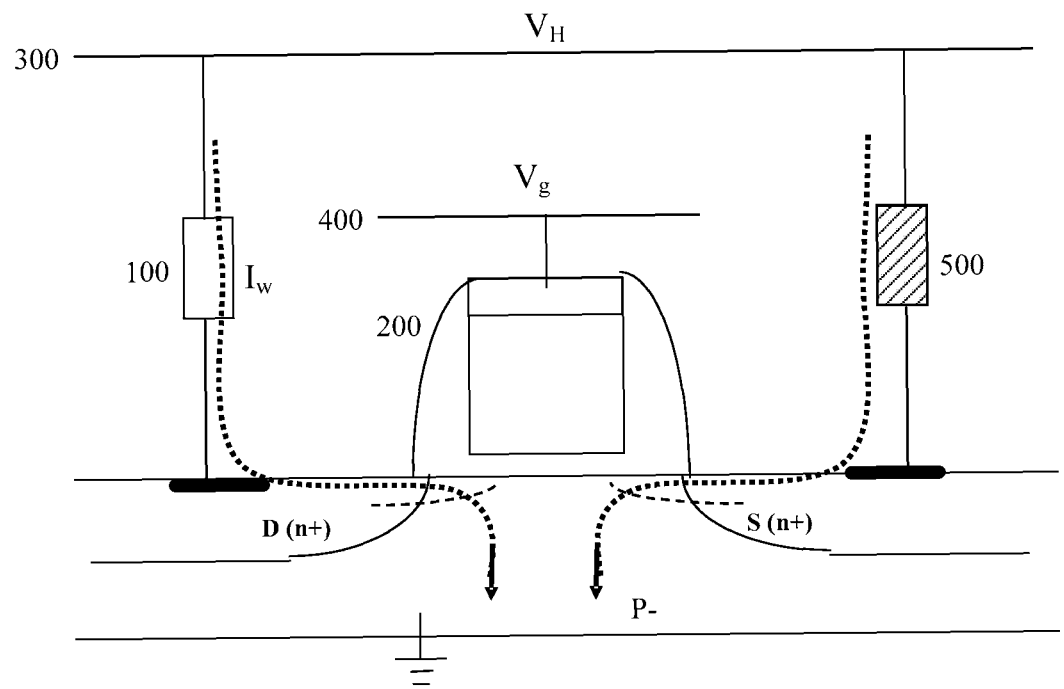
FIG. 9a illustrate the write operation (of the second method) on the second RRAM.
FIG. 9b is a flow chart of the write operation (of the second method) according to the present invention.
Figure 11:
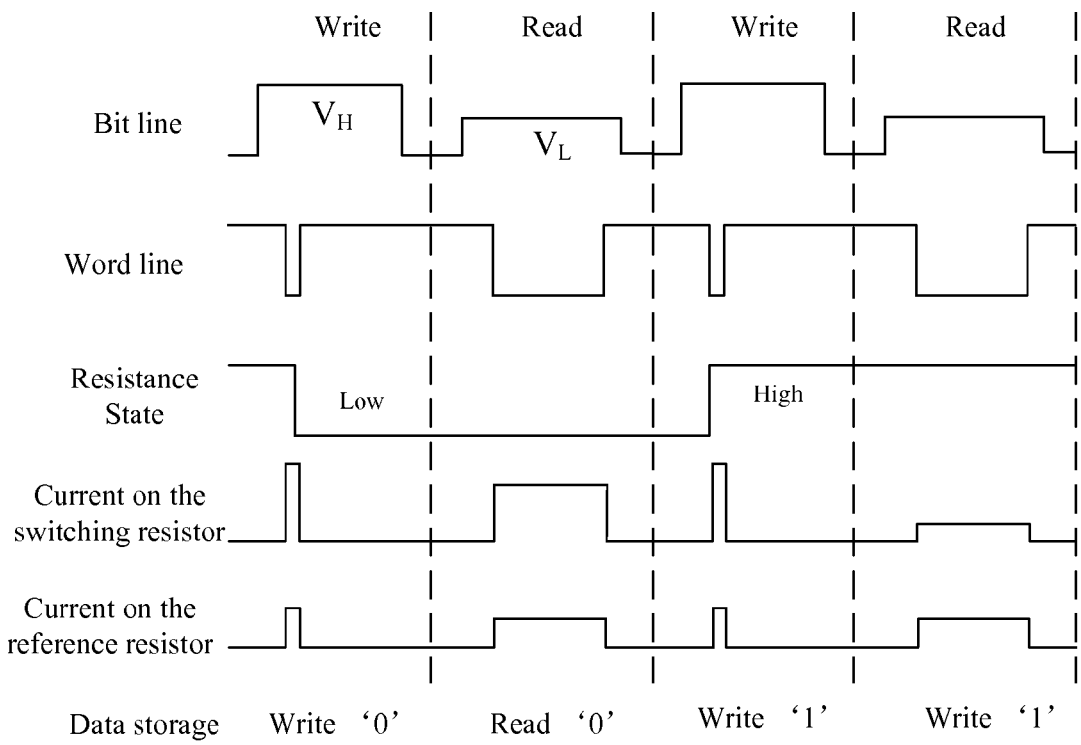
FIG. 11 shows the pulse scheme (for the second method) of operating the second RRAM.

FIG. 11 is a pulse scheme of the second method of operating the second RRAM. FIG. 9a illustrates the write operation (of the second method) on the second RRAM. FIG. 9b is a flow chart of the write operation (of the second method) according to the present invention. Referring to FIGS. 9a, 9b and 11, the write operation of the second method comprises the following steps:

Step 210, a first voltage $V_H$ (+Vcc/2) applied to the bit-line 300 to produce a large enough voltage difference across the drain and the substrate of the MOSFET 200a.

The source of the select transistor 200 is connected to ground.

Step 211, a second voltage pulse is applied to the gate of the MOSFET 200a through the word-line 400 for a short duration (~us to <1 ms). This voltage pulse on gate (or selected word-line) is negative going from 0 v to −Vcc/2, so that a large enough write current pulse $I_w$ is resulted for triggering resistance changes of the switching resistor 100. It should be noted that the write current pulse $I_w$ can be adjusted to be larger if the gate bias is more negative with larger magnitude.

The bias of un-selected word-line is Vcc/2 and it should be less than the Vt of the MOSFET 200a. According to an embodiment of the present invention, a high resistance state of the switching resistor 100 represents data '1' and a low resistance state represents data '0' correspondently. During the write operation, the reference resistor 500 is not degraded and its resistance remains constant.

Figures 10A, 10B:
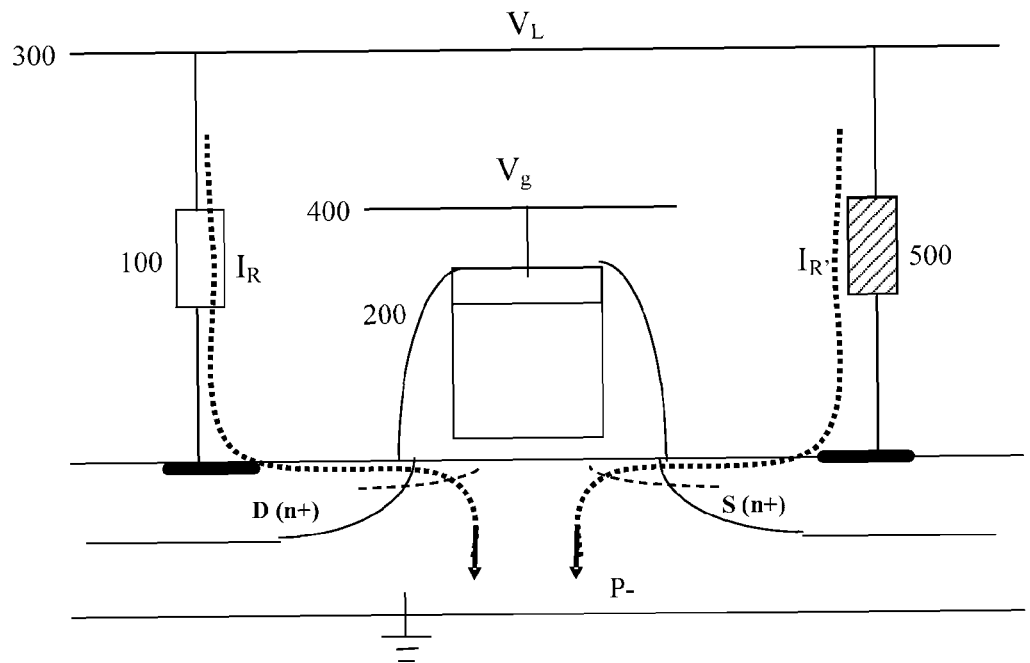
FIG. 10a illustrates the read operation (of the second method) on the second RRAM.
FIG. 10b is a flow chart of the read operation (of the second method) according to the present invention.

FIG. 10a illustrates the read operation (of the second method) on the second RRAM. FIG. 10b is a flow chart of the read operation (of the second method) according to the present invention. With reference to FIGS. 10a, 10b and 11, the read operation of the second method comprises the following steps:

Step 220, a third voltage $V_L$ (0.05 v to 1 v) is applied to the bit-line 300 to produce a small voltage difference between the drain and the substrate of the MOSFET 200a. It shall be properly selected so that the GIDL current is large enough for sense amplifier to detect and small enough to avoid disturb on the resistance.

Step 221, a fourth voltage pulse is applied to the gate of the select transistor 200 through the word-line 400 for a short duration (~us to <1 ms). This voltage pulse on gate (or selected word-line) is negative going from 0 v to −Vcc/2, so that a large enough read current is resulted for sense amplifier to determine the stored data in the switching resistor 100. The sense amplifier simply compares the read current through the switching resistor with respect to the reference current through the reference resistor 500 in each cell.

A larger read current ($I_R$) than the reference current corresponds to a low resistance state of the switching resistor 100 and defined as data '0'; while a smaller $I_R$ corresponds to a high resistance state and defined as data '1'

As described above, the first and the second RRAM are the type of one transistor and one resistance (referred to as 1T1R cell). The following RRAM are the type of one transistor and two resistances (referred to as 1T2R cell).

Figure 12:
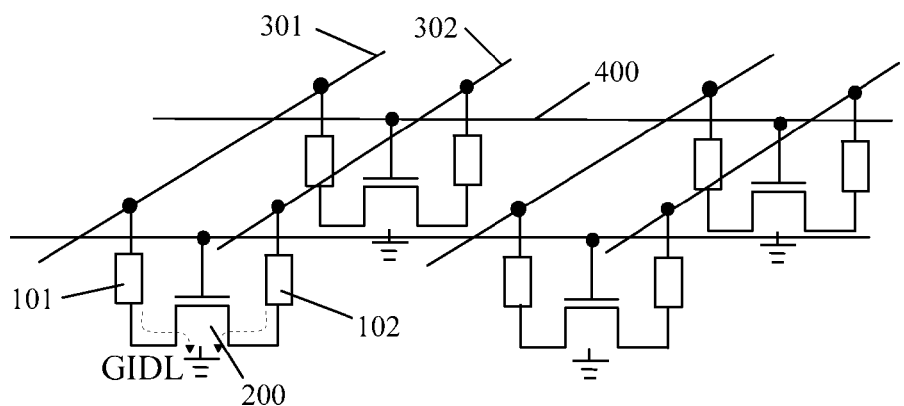
FIG. 12 is the schematic diagram of a third RRAM according to an embodiment of the present invention.

FIG. 12 is the schematic diagram of a third RRAM according to an embodiment of the present invention. Referring to FIG. 12, the third RRAM of the present invention includes a plurality of memory cells arranged in array with bit-lines and word-lines. Each memory cell comprises: a first switching resistor 101, a second switching resistor 102 and a MOSFET 200c. The first switching resistor 101 includes a first terminal and a second terminal, the first terminal of the first switching resistor 101 is connected to a first bit-line 301, and the second terminal of the first switching resistor 101 is connected to the MOSFET 200c. The second switching resistor 102 includes a third terminal and a fourth terminal, the third terminal of the second switching resistor 102 is connected to a second bit-line 302, and the fourth terminal of the second switching resistor 102 is connected to the MOSFET 200c. The MOSFET 200c includes a gate, a source, and a drain. The gate is connected to a word-line 400. The GIDL currents at the drain and source of MOSFET 200c are used for read and write operations of the memory cell.

It is noted that the source of the MOSFET 200c is connected to the second terminal of the first switching resistor 101, the drain of the MOSFET 200c is connected to the fourth terminal of the second switching resistor 102, and the substrate of the MOSFET 200c is connected to ground.

The MOSFET 200c is assumed an n-type MOSFET. In read or write operation, the voltage applied to the gate (or the word-line 400) is always less than the Vt of the MOSFET 200c, so that there is no inversion channel formed between the drain and the source during the read and write operations.

The first switching resistor 101 and the second switching resistor 102 have bi-stable resistance states, and their resistance states can be sensed by comparing the current flowing through the first switching resistor 101 or the second switching resistor 102 with respect to a reference current.

Based on the third RRAM of the present invention, a third method of operating the third RRAM is described below, which includes a write operation and a read operation.

Figure 15:
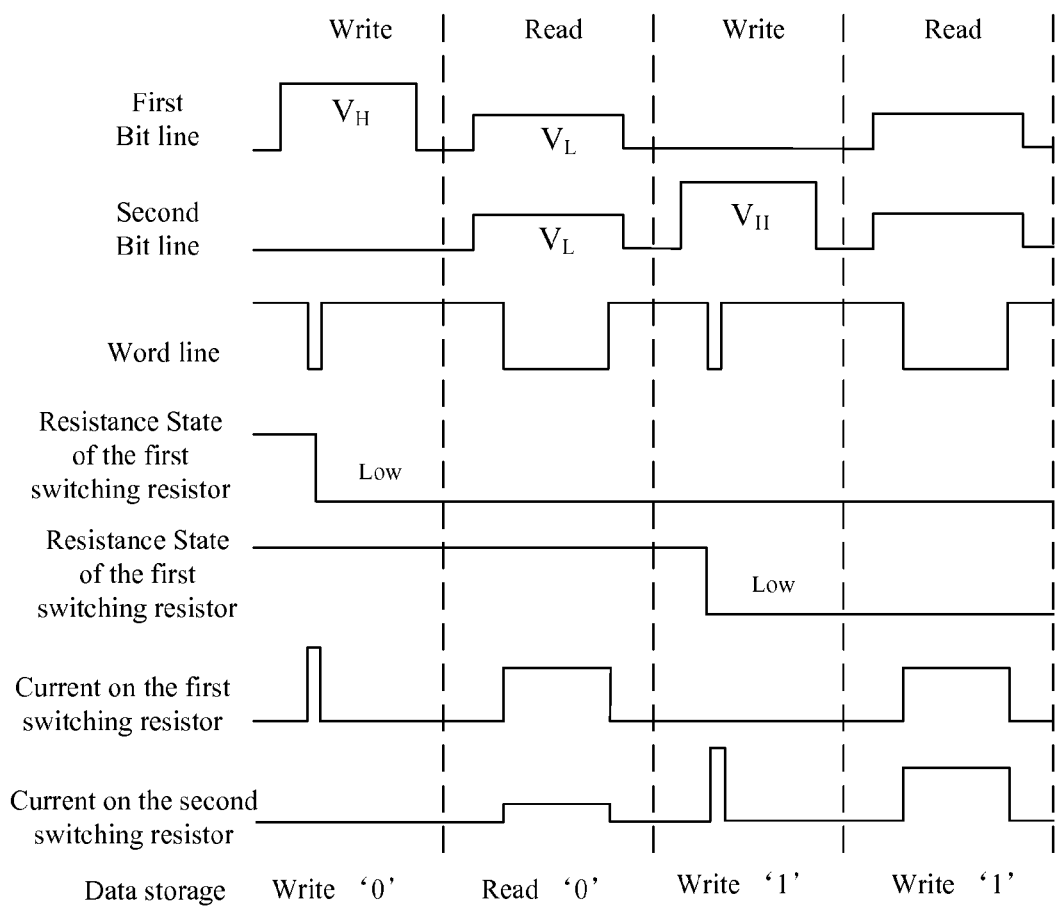
FIG. 15 shows pulse scheme (for the third method) of operating the third RRAM.

FIG. 15 shows a pulse scheme of the third method of operating the third RRAM. FIG. 13a illustrates the write operation (of the third method) on the third RRAM. FIG. 13b is a flow chart of the write operation (of the third method) according to the present invention. Referring to FIGS. 13a, 13b and 15, the write operation of the third method comprises the following steps:

Step S310, a first voltage $V_H$ (+Vcc/2) is applied to the first bit-line 301 or the second bit-line 302 to produce a large enough voltage difference between the first bit line 301 and the substrate of the MOSFET 200c or between the second bit line 302 and the substrate of the MOSFET 200c.

In this embodiment, the write operation of the first switching resistor 101 and the second switching resistor 102 can be independently performed in sequential manner. For example, if the first switching resistor 101 is selected to perform the write operation, the first voltage $V_H$ is applied to the first bit-line 301 and 0 v is applied to the second bit line 302. After completion of the write operation of the first switching resistor, then the second switching resistor can start to perform the write operation by biasing the second bit-line to $V_H$ and the first bit-line is biased to 0 v.

Step 311, a second voltage pulse is applied to the gate of the MOSFET 200c through the word line 400 for a short duration (~us to <1 ms). This voltage pulse on gate (or the selected word-line) is negative going (from 0 v to −Vcc/2), so that a large enough write current pulse $I_w$ is resulted for triggering the resistance change of the switching resistor 101. It should be noted that the write current pulse $I_w$ can be adjusted to be larger if the gate bias is more negative with larger magnitude The bias of un-selected word line is 0 v and it should be less than the Vt of the MOSFET 200c. According to an embodiment of the present invention, a high resistance state of the first or the second switching resistor (101 or 102) represents data '1' and a low resistance state represents data '0' correspondently. Thus, all four binary conditions (00, 01, 10, and 11) or 2-bits data can be stored in one memory cell.

Figure 14A:
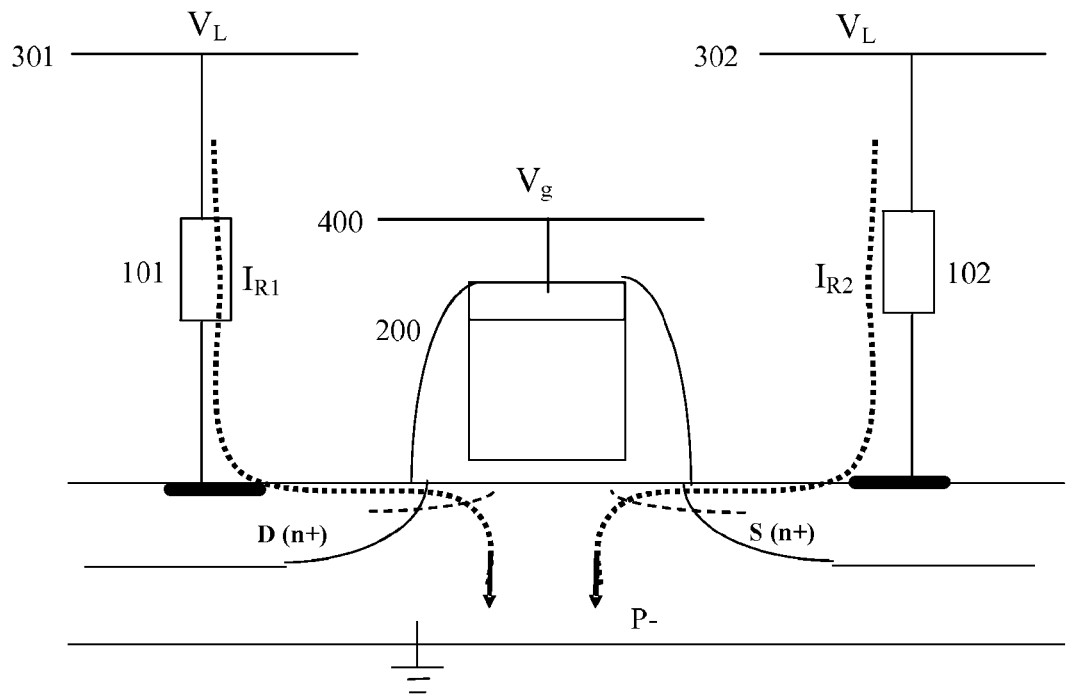
FIG. 14a illustrates the read operation (of the third method) on the third RRAM.
Figure 14B:
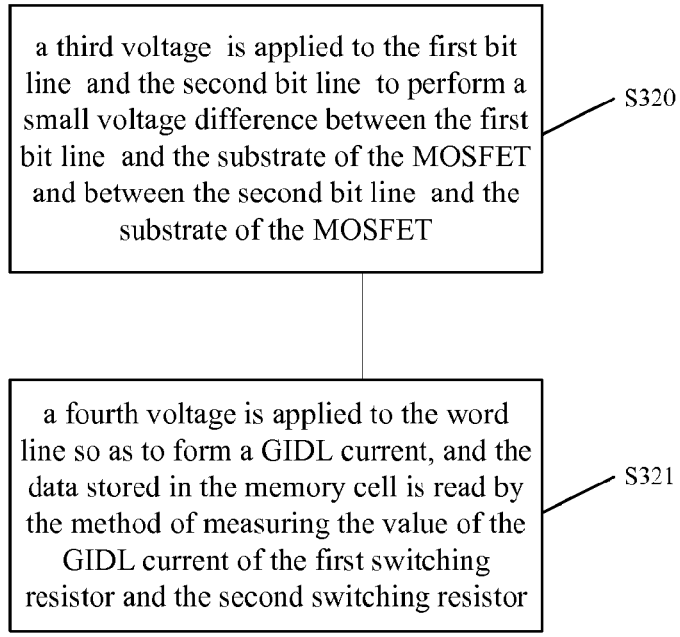
FIG. 14b is a first flow chart of the read operation (of the third method) according to the present invention.

FIG. 14a illustrates the read operation (of the third method) on the third RRAM. FIG. 14b is a flow chart (of the third method) according to the present invention. Referring to FIGS. 14a, 14b and 15, the first read operation of the third method comprises the following steps:

Step S320, a third voltage $V_L$ (0.05 v to 1 v) is applied to the first bit-line 301 and the second bit-line 302. It shall be properly selected so that the GIDL current is large enough for sense amplifier and small enough to avoid disturb on the resistance.

Step 321, a fourth voltage pulse is applied to the gate of the select transistor 200c through the word-line 400 for a short duration (~us to <1 ms). This voltage pulse on gate (or selected word-line) is negative going from 0 v to −Vcc/2, so that a large enough read current is resulted for sense amplifier to determine the stored data in the switching resistors 101 and 102 simultaneously. The read currents through the switching resistors 101 and 102 ($I_{R1}$ and $I_{R2}$) in each respective bit-line are compared in sense amplifier with respect to a reference current respectively. The reference current is provided from periphery circuit.

A high resistance state of the first or the second switching resistor (101 or 102) represents data '1' and a low resistance state represents data '0' correspondently. Thus, all four conditions (00, 01, 10, and 11) or 2-bits data in the memory cell can be determined or read.

As previously described in the third method of operating the third RRAM, the GIDL currents in switching resistors (101 and 102) are measured by respective sense amplifiers during the read operation. If the resistance state of the first switching resistor 101 always keeps opposite to the second switching resistor 102 during write operation, then only one sense amplifier is needed by simply comparing the read current in resistor 101 and 102, i.e. the state of $I_{R1}>I_{R2}$ represents data '1' and the state of $I_{R2}>I_{R1}$ represents data '0'.

Based on the third RRAM of the present invention, a fourth method of operating the third RRAM is described below, which includes a write operation and a read operation.

Figure 16A:
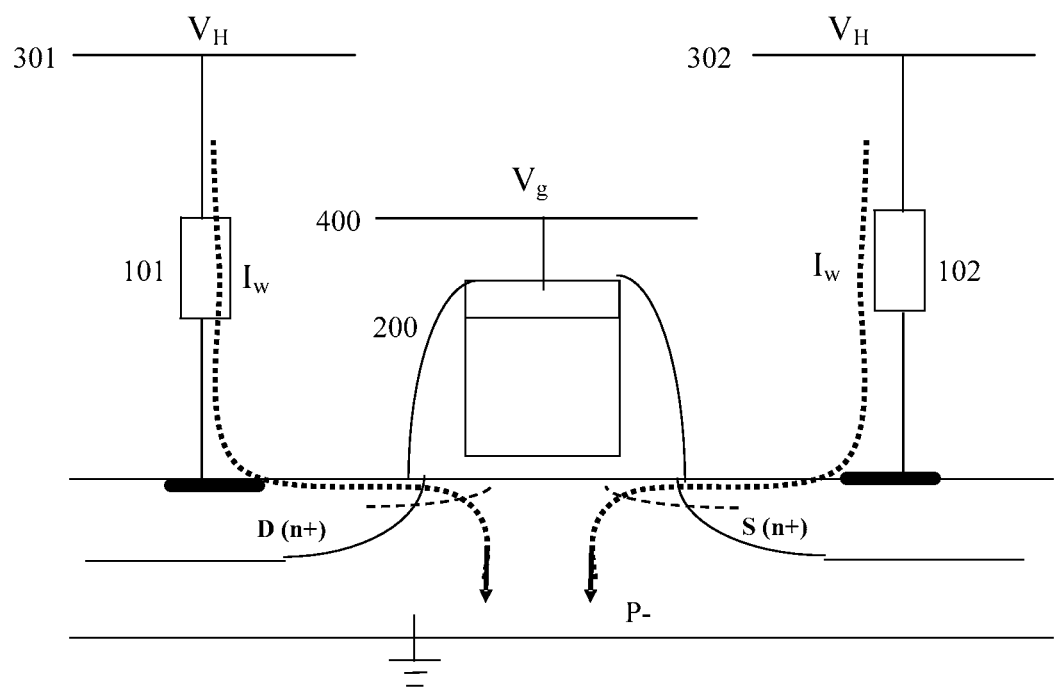
FIG. 16a illustrates the write operation (of the fourth method) on the third RRAM.
Figure 16B:
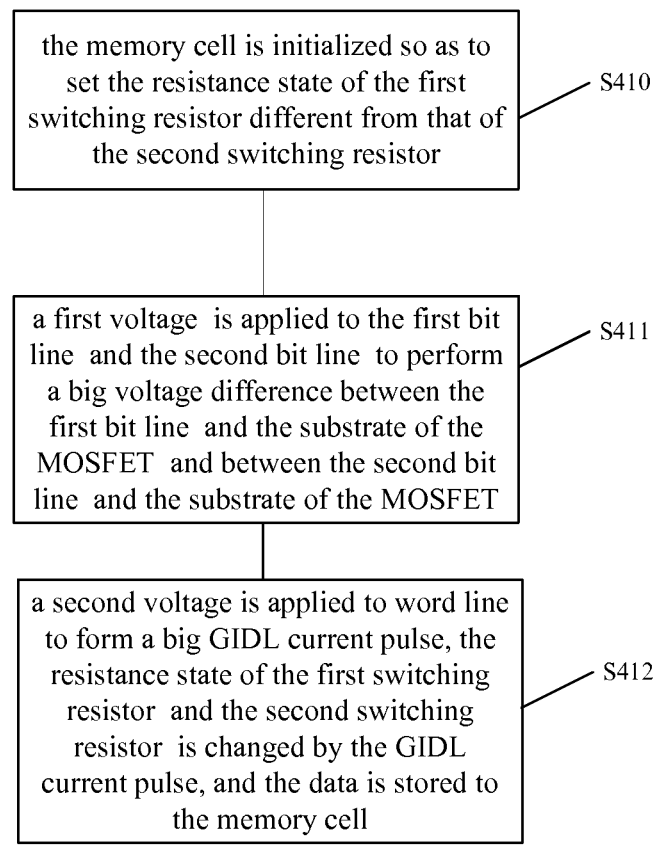
FIG. 16b is a second flow chart of the write operation (of the fourth method) according to the present invention.
Figure 18:
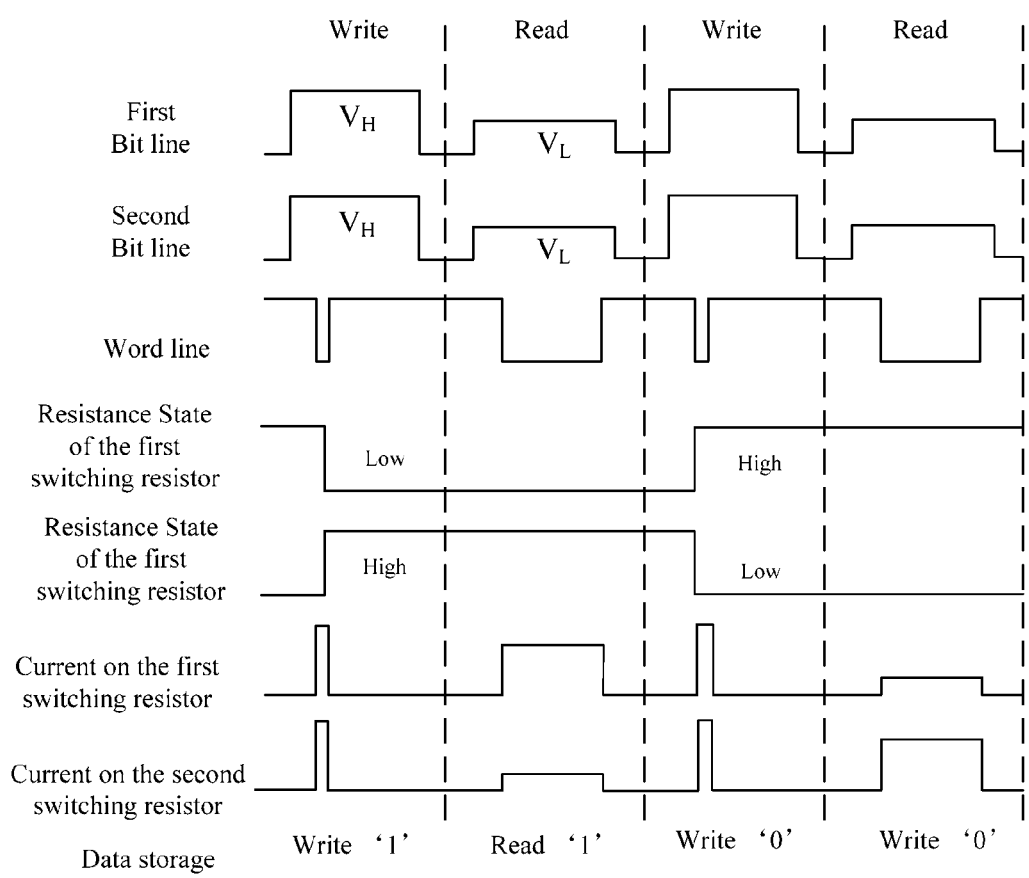
FIG. 18 shows new pulse scheme (for the fourth method) of operating the third RRAM.

FIG. 18 shows the pulse scheme of the fourth method of operating the third RRAM. FIG. 16a illustrates the write operation (of the fourth method) on the third RRAM during the write operation. FIG. 16b is a flow chart of the write operation (of the fourth method) according to the present invention. The write operation of the fourth method comprises the following steps:

Step S410, the memory cell is initialized to the same state, e.g. all resistors are at high resistance state (or "1").

Step 411, a first voltage $V_H$ (+Vcc/2) is applied to the first bit line 301 and a second voltage is applied to the word-line 400 to form a large GIDL current pulse, and the resistance state of the first switching resistor 101 is changed to low resistance state ("0"), then a pair of data "01" is stored in the cell. Similarly, a pair of data "10" can be stored in the $1^{st}$ and $2^{nd}$ resistors.

Figure 17A:
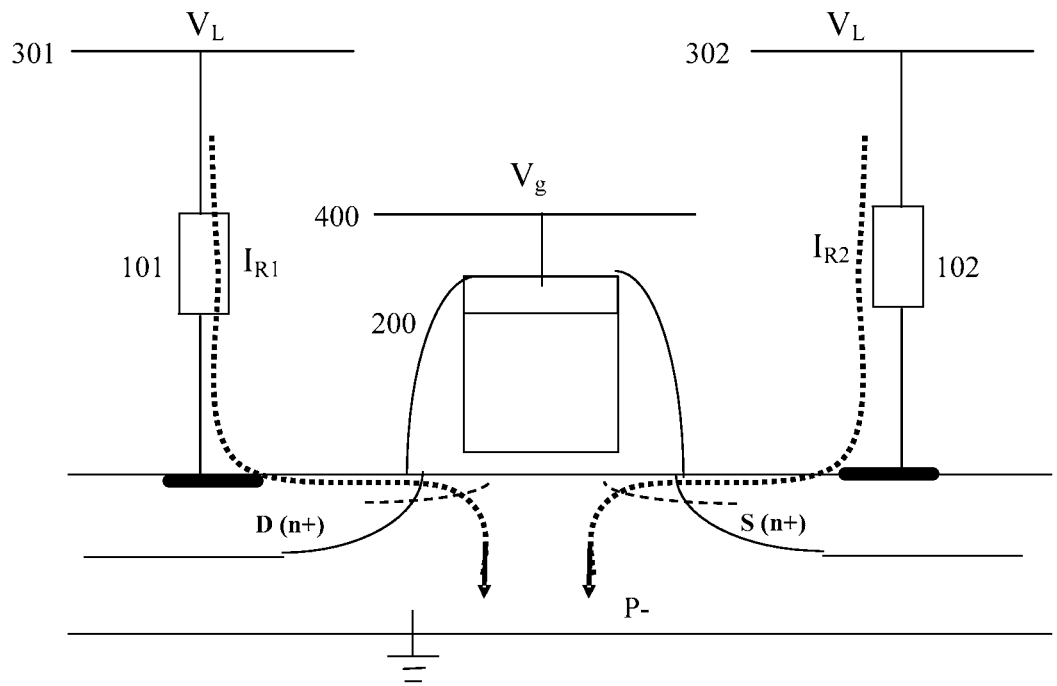
FIG. 17a illustrates the read operation (of the fourth method) on the third RRAM.
Figure 17B:
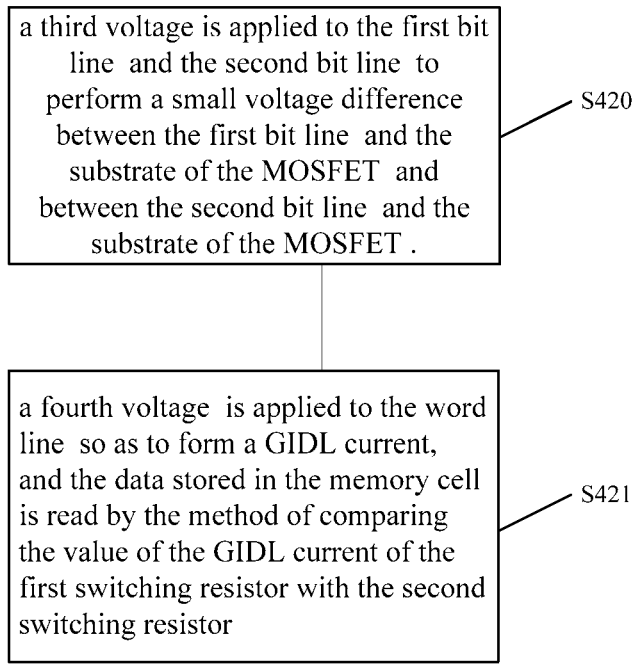
FIG. 17b is a second flow chart of the read operation (of the fourth method) according to the present invention.

FIG. 17a illustrates the read operation (of fourth method) on the third RRAM during the read operation. FIG. 17b is a flow chart of the read operation (of the fourth method) according to the present invention. Referring to FIGS. 17a, 17b and 18, the read operation (of the fourth method) comprises the following steps:

Step S420, a third voltage $V_L$ (0.05 v to 1 v) is applied to the first bit-line 301 and the second bit line 302.

Step S421, the $V_g$ is applied to the gate of the MOSFET 200c through the word-line 400. The GIDL current of flowing through the first switching resistor 101 defines $I_{R1}$, while the GIDL current of flowing through the second switching resistor 102 defines $I_{R2}$. Because the resistance state of the first switching resistor 101 is always in the opposite to the resistance state of the second switching resistor, therefore, if $I_{R1}>I_{R2}$, then the stored data is '1', and similarly, if $I_{R2}>I_{R1}$, then the stored data is '0'.

As should be understood, the present invention is not limited to the switching resistor as illustrated; the switching resistor also includes the phase change resistor.

The present invention has been described in conjunction with the preferred embodiments which, however, do not limit the invention. Various modifications and supplements may be made to the preferred embodiments by the ordinary skill in the art without departing from the spirit and scope of invention as set forth in the appended claims.

What is claimed is:

1. A resistive random access memory, including a plurality of arrayed memory cells, a plurality of bit-lines and a plurality word-lines, each memory cell comprising:
    a switching resistor having a first terminal and a second terminal, the first terminal of the switching resistor being connected to one bit-line; and
    a select transistor being connected to the second terminal and having a gate, a source, a drain and a substrate, the gate being connected to one word-line, read and write operation current being GIDL current of the select transistor.

2. The resistive random access memory as claimed in claim 1, wherein the drain or the source of the select transistor is connected to the second terminal of the switching resistor.

3. The resistive random access memory as claimed in claim 2, wherein the drain of the MOSFET is connected to the source of the select transistor.

4. The resistive random access memory as claimed in claim 1, wherein the substrate of the select transistor is connected to ground.

5. The resistive random access memory as claimed in claim 1, wherein the select transistor is n-type MOSFET or p-type MOSFET.

6. The resistive random access memory as claimed in claim 5, wherein during read operation or write operation of the memory cell, a gate voltage is lower (in magnitude) than threshold voltage of the select transistor.

7. A method of operating the resistive random access memory as claimed in claim 1, comprising:
    a write operation comprising:
        applying a first voltage to the bit-line to produce a large voltage across the drain and the substrate of the select transistor; and
        applying a second voltage pulse to the gate of the select transistor through the word-line for a short duration, the second voltage pulse on gate being negative, so that a large enough write current pulse flows and triggers resistance changes of the switching resistor; and
    a read operation comprising:
        applying a third voltage to the bit-line to produce a small voltage difference between the drain and substrate of the select transistor; and
        applying a fourth voltage pulse to the gate of the select transistor through the word-line for a short duration, comparing the GIDL current with respect to a reference current, and reading data stored in memory cell.

8. The method of operating the resistive random access memory as claimed in claim 7, when forming the GIDL in the MOSFET, the MOSFET is off state.

9. The method of operating the resistive random access memory as claimed in claim 7, wherein in the write operation, a high resistance state of the switching resistor represents data '1' and a low resistance state represents data '0'.

10. The method of operating the resistive random access memory as claimed in claim 9, wherein in the read operation, a high GIDL current represents data '0' and a low gate induced drain leakage current represents data '1'.

* * * * *